United States Patent
Liu (10) Patent No.: US 12,062,610 B2
(45) Date of Patent: Aug. 13, 2024

(54) METHOD FOR FORMING SEMICONDUCTOR STRUCTURE AND SEMICONDUCTOR STRUCTURE

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 350 days.

(21) Appl. No.: 17/400,562

(22) Filed: Aug. 12, 2021

(65) Prior Publication Data

US 2022/0068811 A1    Mar. 3, 2022

Related U.S. Application Data

(63) Continuation of application No. PCT/CN2021/099427, filed on Jun. 10, 2021.

(30) Foreign Application Priority Data

Aug. 27, 2020   (CN) .......................... 202010880910.9

(51) Int. Cl.
*H01L 23/528*    (2006.01)
*H01L 21/311*    (2006.01)
(Continued)

(52) U.S. Cl.
CPC .... *H01L 23/5283* (2013.01); *H01L 21/31144* (2013.01); *H01L 21/76816* (2013.01);
(Continued)

(58) Field of Classification Search
CPC ..... H01L 23/5283; H10B 10/18; H10B 12/50; H10B 20/60; H10B 41/40; H10B 43/40; H10B 51/40; H10B 53/40
See application file for complete search history.

(56) References Cited

U.S. PATENT DOCUMENTS 6,223,432 B1   5/2001  Dennison
6,444,520 B1   9/2002  Dennison
(Continued)

FOREIGN PATENT DOCUMENTS

CN   1508862   A    6/2004
CN   1705080   A    12/2005
CN   111223860 A    6/2020

OTHER PUBLICATIONS

Supplementary European Search Report in the European application No. 21859772.2, mailed on Dec. 19, 2023. 7 pages.

*Primary Examiner* — David A Zarneke
(74) *Attorney, Agent, or Firm* — Kilpatrick Townsend & Stockton LLP (57) ABSTRACT

A method for forming a semiconductor structure and a semiconductor structure are provided. The method includes following operations. A semiconductor substrate is provided. The semiconductor substrate includes an array region and a peripheral region, a plurality of conductive layers are arranged in array region and separated from each other. A support layer covering the semiconductor substrate is formed. An interconnect layer is arranged in support layer located on the array region and extends to peripheral region. The interconnect layer is electrically connected to a respective one of the conductive layers and transmits an electrical signal of the respective one of the conductive layers to the peripheral region. The support layer is patterned to form a plurality of support structures located on the peripheral region and separated from each other and an interconnect structure located on the array region and peripheral region. The interconnect layer is located in the interconnect structure.

6 Claims, 7 Drawing Sheets

(51) Int. Cl.
  *H01L 21/768*    (2006.01)
  *H10B 10/00*     (2023.01)
  *H10B 12/00*     (2023.01)
  *H10B 20/00*     (2023.01)
  *H10B 41/40*     (2023.01)
  *H10B 43/40*     (2023.01)
  *H10B 51/40*     (2023.01)
  *H10B 53/40*     (2023.01)

(52) U.S. Cl.
  CPC ........ *H01L 21/76877* (2013.01); *H10B 10/18* (2023.02); *H10B 12/50* (2023.02); *H10B 20/60* (2023.02); *H10B 41/40* (2023.02); *H10B 43/40* (2023.02); *H10B 51/40* (2023.02); *H10B 53/40* (2023.02)

(56) References Cited

U.S. PATENT DOCUMENTS

| | | |
|---|---|---|
| 7,199,420 B2 | 4/2007 | Kitamura |
| 7,525,173 B2 | 4/2009 | Yang |
| 2005/0265100 A1 | 12/2005 | Kitamura |
| 2015/0047891 A1 | 2/2015 | Lee |
| 2020/0144242 A1 | 5/2020 | Park |

METHOD FOR FORMING SEMICONDUCTOR STRUCTURE AND SEMICONDUCTOR STRUCTURE

CROSS-REFERENCE TO RELATED APPLICATIONS

This application is a continuation application of International Patent Application No. PCT/CN2021/099427, filed on Jun. 10, 2021 and entitled "Method for Forming Semiconductor Structure and Semiconductor Structure", which is based upon and claims priority to Chinese Patent Application No. 202010880910.9, filed on Aug. 27, 2020 and entitled "Method for Forming Semiconductor Structure and Semiconductor Structure". The contents of International Patent Application No. PCT/CN2021/099427 and Chinese Patent Application No. 202010880910.9 are hereby incorporated by reference in their entireties.

TECHNICAL FIELD

The disclosure relates to the field of semiconductors, and particularly to a method for forming a semiconductor structure and a semiconductor structure.

BACKGROUND

A memory is one of the key devices that determine system performance. The memory is like a temporary warehouse, and is responsible for data transfer and temporary storage. The memory typically adopts a way that a transistor is connected to a memory capacitor to constitute a memory cell, and controls a process of charging/discharging the memory capacitor through the conduction of the transistor.

In the manufacturing process of connecting the transistor and the memory capacitor, a contact structure is typically used to resolve the difference between the arrangement of the transistors and the arrangement of the memory capacitors. However, in the manufacturing process of the contact structure, since the coverage area of the contact structure may be too large, the stress on the contact structure is too large, causing metal peeling of the memory, which affects the yield of the formed memory.

SUMMARY

The embodiments of the disclosure provide a method for forming a semiconductor structure and a semiconductor structure, which resolve the difference between the arrangement of the transistors and the arrangement of the memory capacitors by forming a contact structure with a smaller coverage area, and avoid metal peeling of the memory.

In order to solve the above-mentioned problem, the embodiments of the disclosure provide a method for forming a semiconductor structure, which includes the following operations. A semiconductor substrate is provided, the semiconductor substrate including an array region and a peripheral region, a plurality of conductive layers being arranged in the array region and separated from each other. A support layer covering the semiconductor layer is formed, an interconnect layer being arranged in the support layer located on the array region, the interconnect layer extending to the peripheral region, the interconnect layer being electrically connected to a respective one of the conductive layers and transmitting an electrical signal of the respective one of the conductive layers to the peripheral region. The support layer is patterned to form a plurality of support structures located on the peripheral region and separated from each other and an interconnect structure located on the array region and the peripheral region, the interconnect layer being located in the interconnect structure, voids being provided between the support structures separated from each other to reduce an area of the peripheral region occupied by the support structures.

The embodiments of the disclosure further provide a semiconductor structure, including: a semiconductor substrate including an array region and a peripheral region, a plurality of conductive layers being arranged in the array region and separated from each other; a plurality of support structures separated from each other and located on the peripheral region, the support structures including a support layer, voids being provided between the support structures separated from each other to reduce an area of the peripheral region occupied by the support structures; and an interconnect structure located on the array region and the peripheral region, the interconnect structure including the support layer and an interconnect layer located in the support layer, the interconnect layer being electrically connected to a respective one of the conductive layers and transmitting an electrical signal of the respective one of the conductive layers to the peripheral region.

DETAILED DESCRIPTION

At present, in the manufacturing process of connecting a transistor and a memory capacitor, a contact structure is typically used to resolve the difference between the arrangement of the transistors and the arrangement of the memory capacitors. However, in the manufacturing process of the contact structure, since the coverage area of the contact structure may be too large, the stress on the contact structure is too large, causing metal peeling of the memory, which affects the yield of the formed memory.

In order to solve the above-mentioned problem, an embodiment of the disclosure provides a method for forming a semiconductor structure, which includes the following operations. A semiconductor substrate is provided. The semiconductor substrate includes an array region and a peripheral region, and a plurality of conductive layers are arranged in the array region and separated from each other. A support layer covering the semiconductor layer is formed. An interconnect layer is arranged in the support layer located on the array region and extends to the peripheral region. The interconnect layer is electrically connected to a respective one of the conductive layers and transmits an electrical signal of the respective one of the conductive layers to the peripheral region. The support layer is patterned to form a plurality of support structures located on the peripheral region and separated from each other and an interconnect structure located on the array region and the peripheral region. The interconnect layer is located in the interconnect structure. Voids are provided between the support structures separated from each other to reduce an area of the peripheral region occupied by the support structures.

In order to make the objectives, technical solutions, and advantages of the embodiments of the disclosure clearer, each embodiment of the disclosure will be described below in detail in combination with the drawings. However, those of ordinary skill in the art can understand that, in each embodiment of the disclosure, many technical details are proposed to make readers understand the disclosure better. However, the technical solutions claimed by the disclosure may also be implemented even without these technical details and various variations and modifications made based on each of the following embodiments. Division of each of the following embodiments is for ease of description and should not form any limit to specific implementation modes of the disclosure. Each embodiment can be combined and refer to each other without conflicts.

FIG. 1 to FIG. 20 illustrate schematic diagrams corresponding to operations of a method for forming a semiconductor structure provided by the embodiments of the disclosure. The method for forming the semiconductor structure provided in the embodiments will be described below in detail in combination with the drawing.

Figure 1:
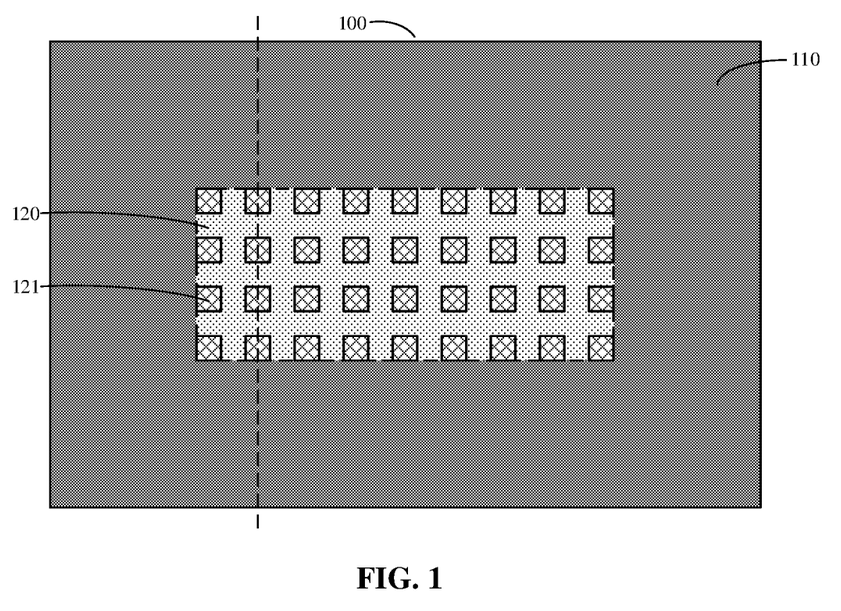
FIG. 1 to FIG. 20 illustrate schematic diagrams of a semiconductor structure corresponding to operations provided in the embodiments of this disclosure.
Figure 2:
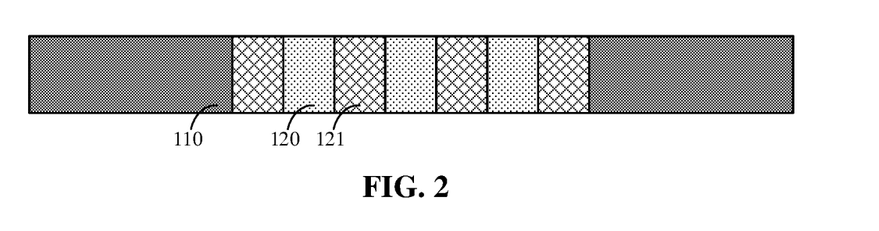

Referring to FIG. 1 and FIG. 2, FIG. 1 is a schematic diagram of a top view of a semiconductor substrate, and FIG. 2 is a schematic sectional view along a dashed line shown in FIG. 1. A semiconductor substrate 100 is provided. The semiconductor substrate 100 includes an array region 120 and a peripheral region 110. A plurality of conductive layer 121 are arranged in the array region 120 and separated from each other.

It is to be noted that the semiconductor substrate 100 provided in the embodiment is formed bit line structures and capacitive contact structures between the bit line structures. A top surface of the capacitive contact structure is exposed at a surface of the semiconductor substrate 100 to subsequently form a contact structure, to be electrically connected to a subsequently formed lower electrode plate of a memory capacitor. The exposed capacitive contact structure is the plurality of conductive layers 121 separated from each other mentioned above.

Referring to FIG. 3 to FIG. 15, a support layer 200 covering the semiconductor substrate 100 is formed. An interconnect layer is arranged in the support layer located on the array region 120 and extends to the peripheral region 110. The interconnect layer is electrically connected to a respective one of the conductive layers and transmits an electrical signal of the respective one of the conductive layers to the peripheral region 110.

In this embodiment, the support layer 200 is a stack that is sequentially formed. The operation that the support layer 200 covering the semiconductor substrate 100 is formed includes the following operation. N sub-support layers stacked one after another are sequentially formed to constitute the support layer 200, where N is a natural number greater than or equal to 2.

The operation that the support layer 200 is formed in this embodiment will be described below in detail in combination with the drawing. It is to be noted that, in this embodiment, the formation of the stack where N is equal to 4 is taken as an example to describe and is not limitation to the embodiments of the disclosure. In other embodiments, N may be a natural number greater than or equal to 2, such as 2, 3, or 5 etc.

Specifically, the operation that an $i^{th}$ sub-support layer is formed includes the following operations. An $i^{th}$ sub-support film is formed at a top surface of a $(i-1)^{th}$ sub-support layer. An $i^{th}$ sub-interconnect layer is formed in the $i^{th}$ sub-support film to constitute the $i^{th}$ sub-support layer, where i is a natural number greater than or equal to 2 and less than or equal to N. In a case that i is equal to 1, a first sub-support film is formed at the top surface of the semiconductor substrate, and a first interconnect layer is formed in the first sub-support film to constitute a first sub-support layer.

Figure 3:
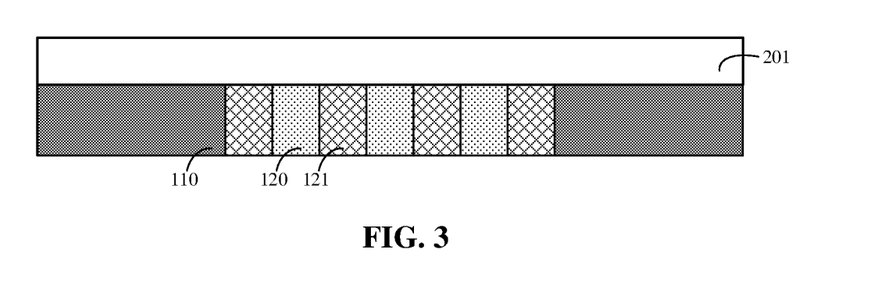

Referring to FIG. 3, a first sub-support film 201 covering the semiconductor substrate 100 is formed.

The first sub-support film 201 is made of an insulating material, such as silicon nitride, silicon oxide, or silicon oxynitride. In this embodiment, the material of the first sub-support film 201 is silicon nitride.

Figure 4:
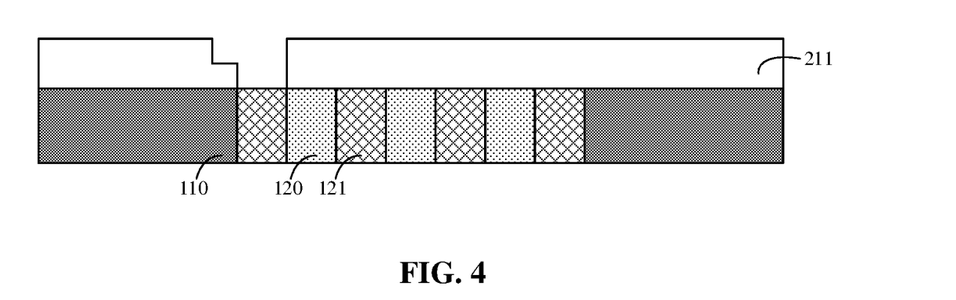

Referring to FIG. 4, a part of the first sub-support film 201 is etched to form a first trench that exposes the leftmost conductive layer 121 as shown in FIG. 4. A left side of the sectional view corresponds to a lower side of the top view. The remaining part of the first sub-support film 201 constitutes a first sub-support layer 211.

Figure 5:
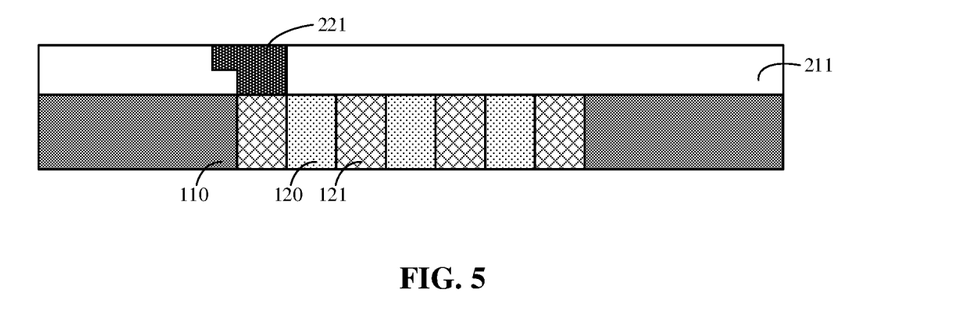

Referring to FIG. 5, a first sub-interconnect layer 221 filling the first trench is formed.

The first sub-interconnect layer 221 may be made of one or more conductive materials, such as doped poly-crystalline silicon, titanium, titanium nitride, tungsten, a composite of tungsten, or the like. In this embodiment, the material of the first sub-interconnect layer 221 is tungsten.

Figure 6:
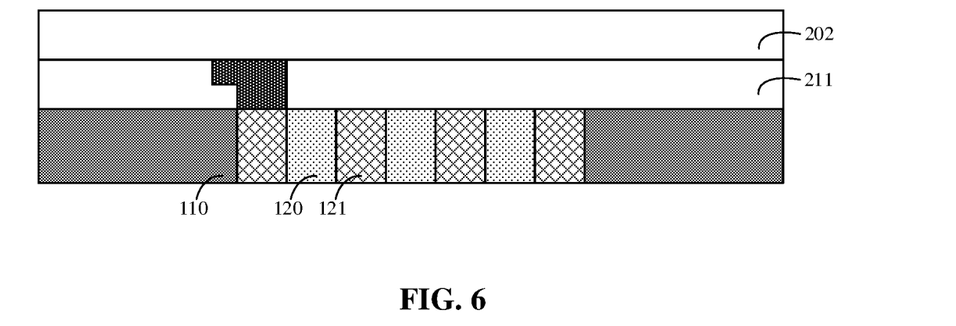

Referring to FIG. 6, a second sub-support film 202 covering the first sub-support film 201 is formed.

The second sub-support film 202 is made of an insulating material, such as silicon nitride, silicon oxide, or silicon oxynitride. In this embodiment, the material of the second sub-support film 202 is silicon nitride.

Figure 7:
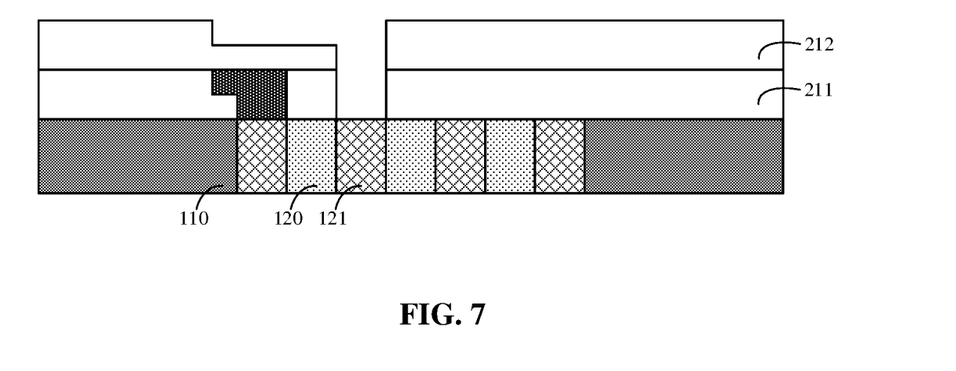

Referring to FIG. 7, a part of the second sub-support film 202 is etched to form a second trench, and the first sub-support layer 211 is etched based on the second trench until the second conductive layer 121 from the left shown in FIG. 7 is exposed. The remaining part of the second sub-support film 202 constitutes a second sub-support layer 212.

Figure 8:
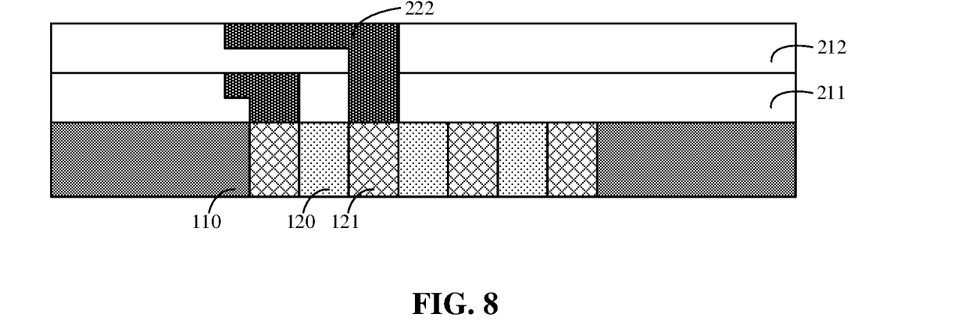

Referring to FIG. 8, a second sub-interconnect layer 222 filling the second trench and a second through hole is formed.

The second sub-interconnect layer 222 may be made of one or more conductive materials, such as doped poly-crystalline silicon, titanium, titanium nitride, tungsten, a composite of tungsten, or the like. In this embodiment, the material of the second sub-interconnect layer 222 is tungsten.

Figure 9:
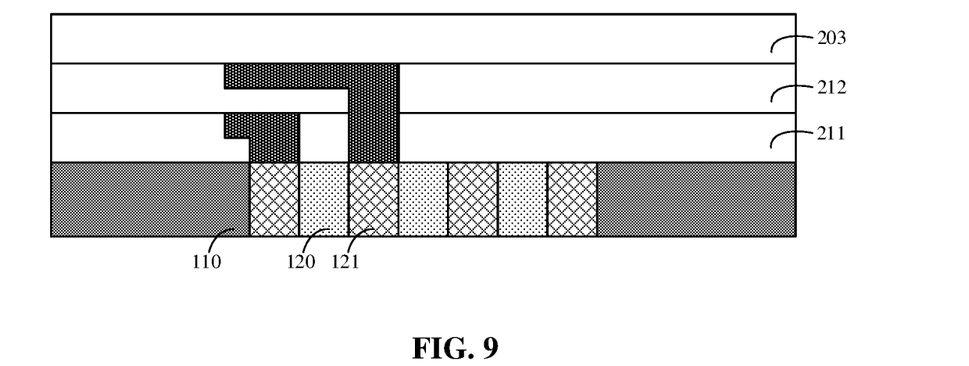

Referring to FIG. 9, a third sub-support film 203 covering the second sub-support layer 212 is formed.

The third sub-support film 203 is made of an insulating material, such as silicon nitride, silicon oxide, or silicon oxynitride. In this embodiment, the material of the third sub-support film 203 is silicon nitride.

Figure 10:
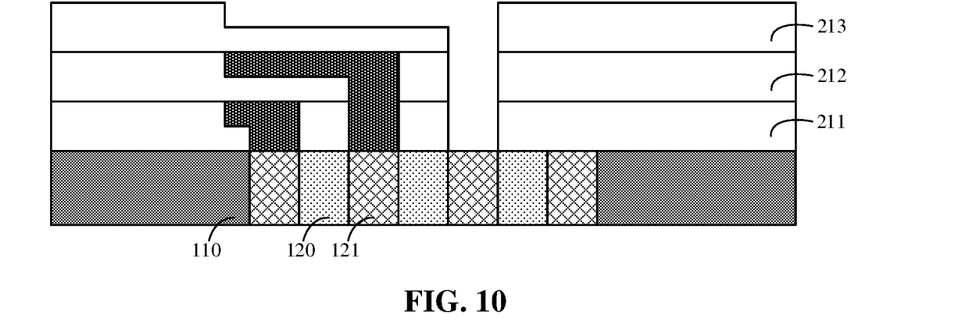

Referring to FIG. 10, a part of the third sub-support film 203 is etched to form a third trench, and the second sub-support layer 212 and the first sub-support layer 211 are etched based on the third trench until the second conductive layer 121 from the right shown in FIG. 10 is exposed. A right side of the sectional view corresponds to an upper side of the top view, and the remaining part of the third sub-support film 203 constitutes a third sub-support layer 213.

Figure 11:
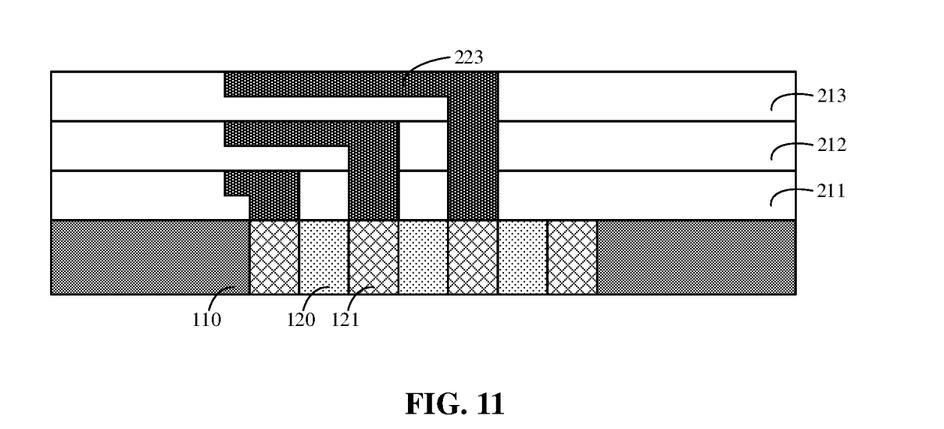

Referring to FIG. 11, a third sub-interconnect layer 223 filling the third trench and a third through hole is formed.

The third sub-interconnect layer 223 may be made of one or more conductive materials, such as doped poly-crystalline silicon, titanium, titanium nitride, tungsten, a composite of tungsten, or the like. In this embodiment, the material of the third sub-interconnect layer 223 is tungsten.

Figure 12:
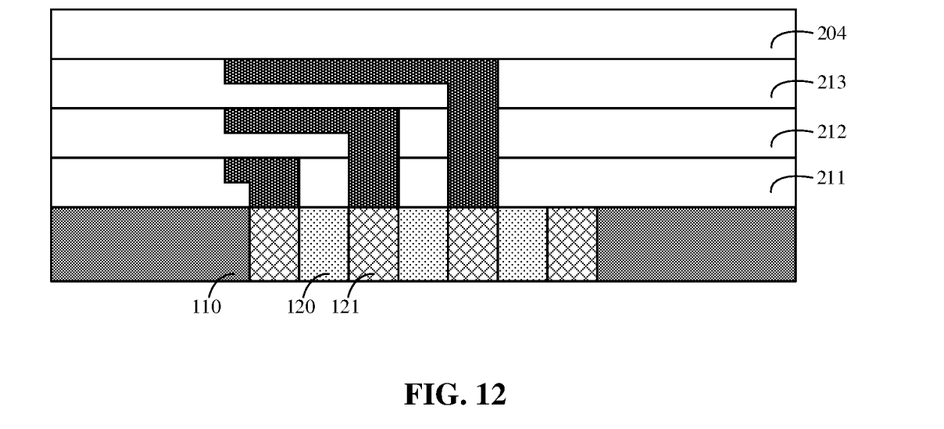

Referring to FIG. 12, a fourth sub-support film 204 covering the third sub-support film 203 is formed.

The fourth sub-support film 204 is made of an insulating material, such as silicon nitride, silicon oxide, or silicon oxynitride. In this embodiment, the material of the fourth sub-support film 204 is silicon nitride.

Figure 13:
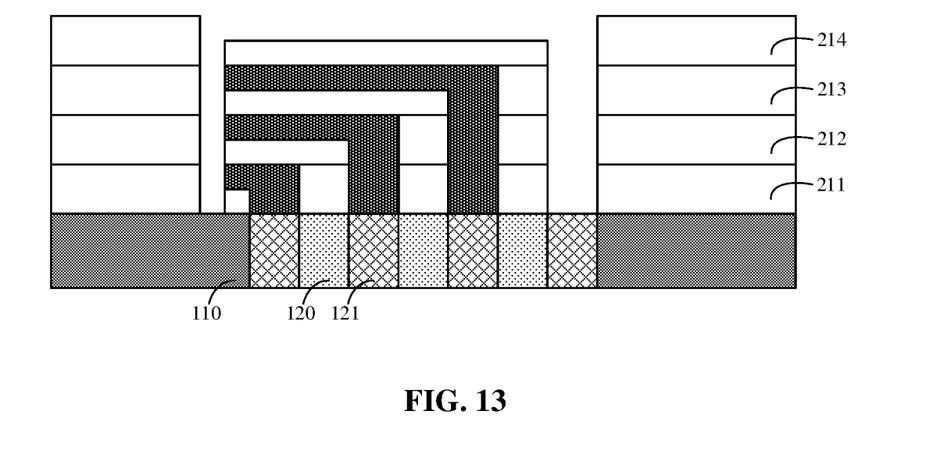

Referring to FIG. 13, a part of the fourth sub-support film 204 is etched to form a fourth trench, and the third sub-support layer 213, the second sub-support layer 212, and the first sub-support layer 211 are etched based on the fourth trench until the rightmost conductive layer 121 shown in FIG. 13 is exposed. A right side of the sectional view corresponds to an upper side of the top view, and the remaining part of the fourth sub-support film 204 constitutes a fourth sub-support layer 214.

Figure 14:
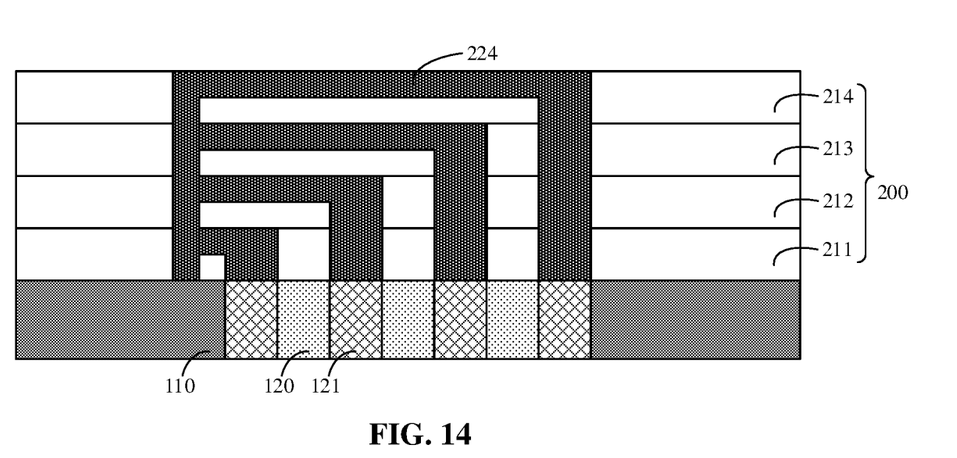

Referring to FIG. 14, a fourth sub-interconnect layer 224 filling the fourth trench and a fourth through hole is formed.

The fourth sub-interconnect layer 224 may be made of one or more conductive materials, such as doped polycrystalline silicon, titanium, titanium nitride, tungsten, a composite of tungsten, or the like. In this embodiment, the material of the fourth sub-interconnect layer 224 is tungsten.

The first sub-interconnect layer 221, the second sub-interconnect layer 222, the third sub-interconnect layer 223, and the fourth sub-interconnect layer 224 jointly constitute the interconnect layer. The first sub-support layer 211, the second sub-support layer 212, the third sub-support layer 213, and the fourth sub-support layer 214 jointly constitute the support layer 200.

Figure 15:
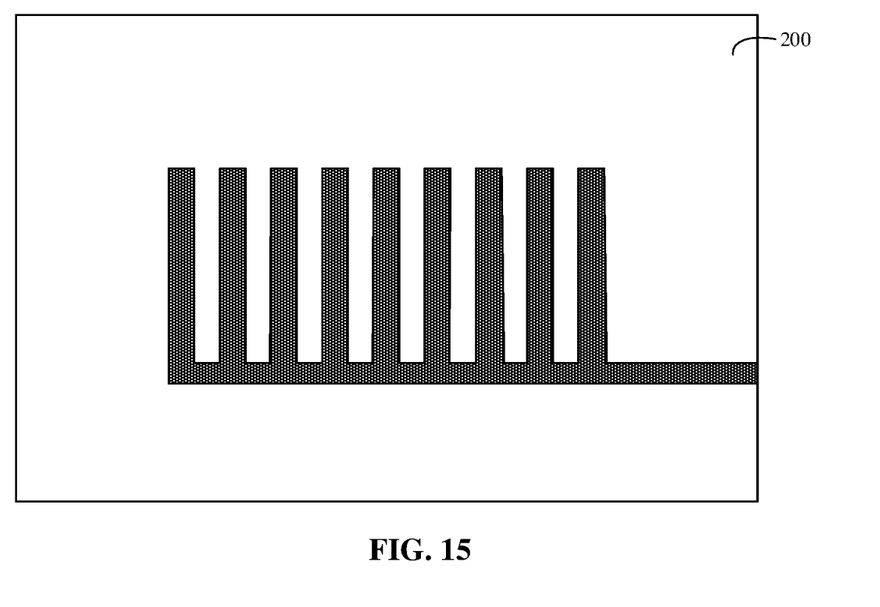

Referring to FIG. 13, during a formation of the fourth trench, an interconnect trench is formed in the peripheral region close to the leftmost conductive layer 121. Referring to FIG. 14, when the fourth sub-interconnect layer 224 is formed, the interconnect trench is filled to form an interconnect epitaxy. Referring to FIG. 15, FIG. 15 is a schematic top view of an interconnect structure and an interconnect layer. The interconnect epitaxy is located in the peripheral region 110 to interconnect an electrical signal of the conductive layers 121 in the array region 120 with the peripheral region 110 for performance test on the conductive layers 121 subsequently connected to a test device. That is, a performance test on a formed capacity contact of a memory through the test device is subsequently formed.

It is to be noted that, in this embodiment, the interconnect epitaxy and the fourth sub-interconnect layer 224 are formed in one process so as to prevent the layers from being in contact with each other, and the conductive effect is good.

In other embodiments, the interconnect epitaxy and the fourth sub-interconnect layer may be deposited in different operations. Further, when the interconnect layer is formed by a stacked structure, the aspect ratio of a through hole that needs to be etched to form each sub-interconnect layer is small, so that the morphology of the through hole formed after etching is good, and the contact between the sub-interconnect layer and a respective one of the conductive layers 121 is good.

Figure 16:
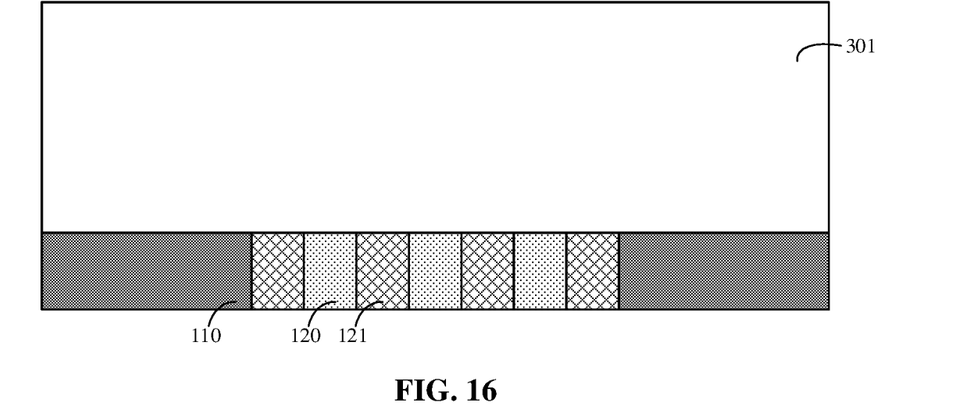
Figure 17:
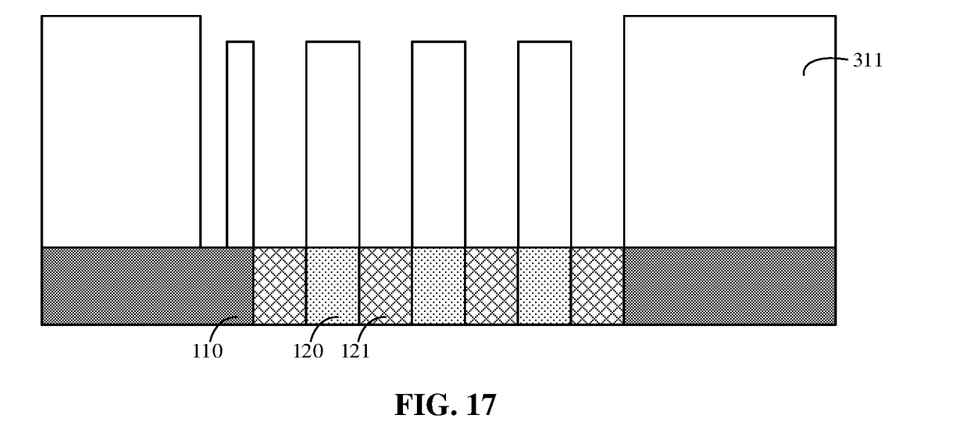
Figure 18:
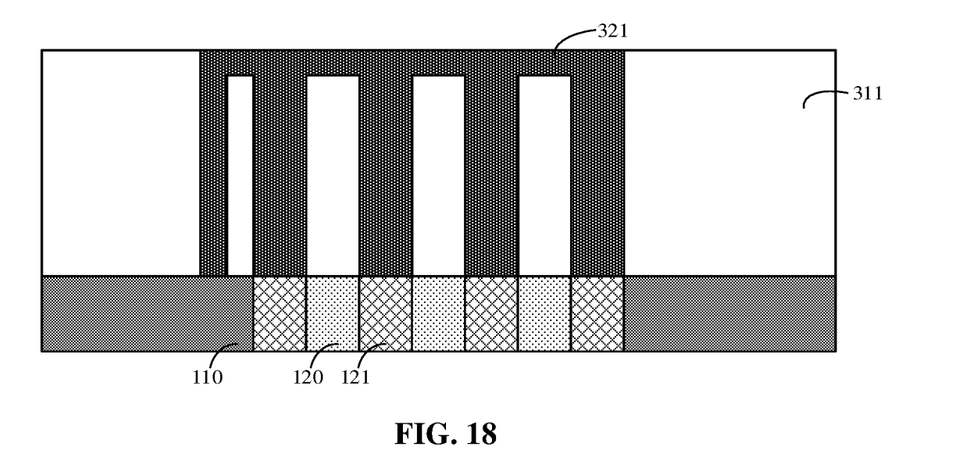

In other embodiments, referring to FIG. 16 to FIG. 18, the support layer and the interconnect layer may also be formed in a single-layer structure. Specifically, referring to FIG. 16, a support film 301 covering the semiconductor substrate 100 is formed. The support film 301 is patterned to form through holes exposing the conductive layers 121. The remaining part of the support film 301 constitutes the support layer 311. An interconnect layer filling the through holes is formed.

Figure 19:
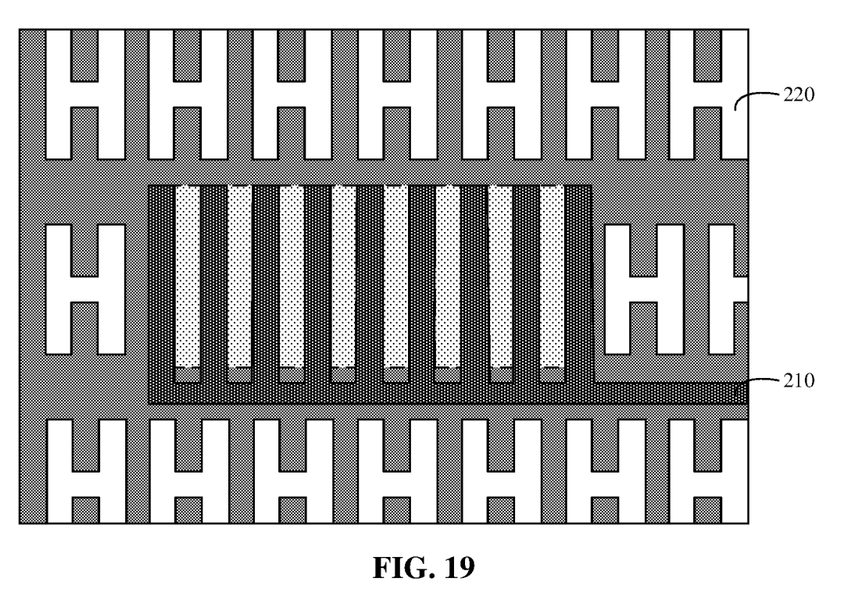

Referring to FIG. 19, the support layer 200 is patterned to form a plurality of support structures 220 located on the peripheral region 110 and separated from each other and an interconnect structure 210 located on the array region 120 and the peripheral region 110. The interconnect layer is located in the interconnect structure 210, and voids are provided between the support structures 220 separated from each other to reduce the area of the peripheral region 110 occupied by the support structures 220.

Specifically, the operation that the support layer 200 is patterned includes the following operations. A mask layer and a patterned photoresist are sequentially formed on the support layer 200. The patterned photoresist includes a first pattern located in the array region 120 and a second pattern located in the peripheral region 110. The mask layer is patterned based on the patterned photoresist, and the support layer is patterned based on the mask layer.

Specifically, the formed patterned photoresist includes a light-transmitting region and a light-blocking region. The light-blocking region constitutes the first pattern in the array region 120, and the first pattern is a top morphology of the interconnect structure. The light-blocking region constitutes the second pattern in the peripheral region 110, and the second pattern is a top morphology of the support structure, which may be round, square, I-shaped, or the like. The light transmittance of the light-transmitting region is greater than that of the light-blocking region. In the subsequent photolithography process, light can pass through the light-transmitting region to irradiate on the mask layer to etch the mask layer.

In this embodiment, the second pattern in the peripheral region 110 is I-shaped, that is, each of the formed support structures 220 is an I-shaped structure. By adopting an I-shaped structure, the support structures can greatly reduce the area of the peripheral region 110 occupied by the support structures 220, thereby reducing the stress on the support structures 220 and thus preventing metal peeling from occurring in the formed semiconductor structure. Further, the I-shaped structure has good stability and is not easy to collapse.

Figure 20:
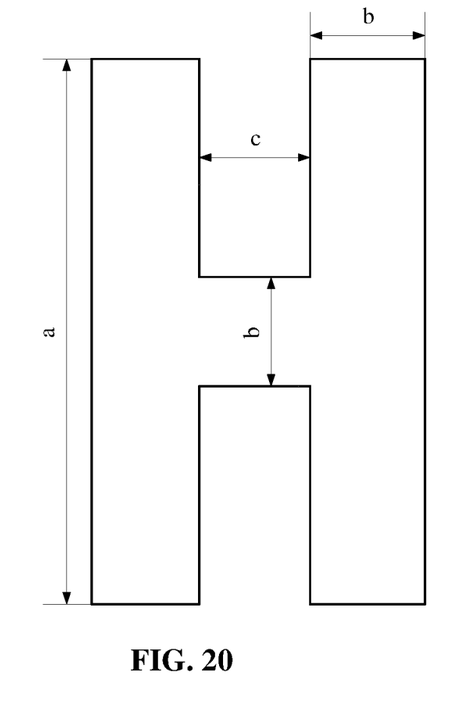

Referring to FIG. 20, each of the formed support structures has an I-shape with a length ranging from 0.2 um to 0.4 um, that is, the length indicated by a in the figure ranges from 0.2 um to 0.4 um, such as 0.25 um, 0.30 um, or 0.35 um. Each of the support structures has an I-shape with a width less than 0.15 um, that is, the width indicated by b in the figure is less than 0.15 um, such as 0.06 um, 0.09 um, or 0.12 um. A gap of each of the I-shaped support structures has a width ranging from 0.3 um to 0.5 um, that is, the width indicated by c in the figure ranges from 0.3 um to 0.5 um, such as 0.35 um, 0.40 um, or 0.45 um.

In this embodiment, a is equal to 0.30 um, b is equal to 0.05 um, and c is equal to 0.40 um. Therefore, each of the I-shaped structures formed has larger space, which further reduces the coverage area of the contact structure.

In this embodiment, each of the formed I-shaped structure has an I-shape whose width is greater than twice the minimum line width of the semiconductor substrate 100. Therefore, the stability of the formed support structures 220 is further ensured.

Compared with the method in the related art, the support structures in the peripheral region and the interconnect structure in the array region are simultaneously formed through a one etching process in this disclosure, which simplifies the process flow, thereby reducing the manufacturing cost of the semiconductor structure. Furthermore, the support structures located on the peripheral region and separated from each other and voids, which are formed through patterning, greatly reduce the area of the peripheral region occupied by the support structures, thereby reducing the stress on the support structures and preventing metal peeling from occurring in the memory formed by the above-mentioned semiconductor structure.

The above operations are divided only for clear description. During implementation, the operations may be combined into one operation, or some operations may be split into a plurality of operations, and any solution including the same logical relationship falls within the scope of protection of the disclosure. Adding insignificant modifications to the flow or introducing insignificant designs without changing the core design of the flow falls within the scope of protection of the disclosure.

Another embodiment of the disclosure relates to a semiconductor structure.

The semiconductor structure provided in the embodiment will be described below in detail in combination with the drawing. Parts which are the same as or corresponding to the above-mentioned embodiments will not be elaborated below.

Referring to FIG. 1 and FIG. 20, a semiconductor structure includes:

a semiconductor substrate 100 including an array region 120 and a peripheral region 110, a plurality of conductive layers 121 being arranged in the array region 120 and separated from each other; a plurality of support structures 220 separated from each other and located on the peripheral region 110, the support structures 220 including a support layer, voids being provided between the support structures 220 separated from each other to reduce the area of the peripheral region occupied by the support structure 220; an interconnect structure 210 located on the array region 120 and the peripheral region 110, the interconnect structure 210 including the support layer and an interconnect layer located in the support layer, the interconnect layer being electrically connected to a respective one of the conductive layers 121 and transmitting an electrical signal of the respective one of the conductive layers 121 to the peripheral region.

It is to be noted that the semiconductor substrate 100 provided in the embodiment is formed bit line structures and a capacitive contact structure between the bit line structures. A top surface of the capacitive contact structure is exposed to subsequently form a contact structure, to be electrically connected to a subsequently formed lower electrode plate of a memory capacity. The exposed capacitive contact structure is the above plurality of conductive layers 121 separated from each other.

Specifically, in this embodiment, the interconnect structure 210 is a stack. The interconnect structure 210 formed by a 4-layer stack is taken as an example in this embodiment to specifically introduce the interconnect structure 210, and the number of layers of the stack does not constitute a limitation to the embodiments of the disclosure.

The interconnect structure includes the first sub-interconnect layer, the second sub-interconnect layer, the third sub-interconnect layer, and the fourth sub-interconnect layer that are sequentially stacked on the semiconductor substrate. The first sub-interconnect layer, the second sub-interconnect layer, the third sub-interconnect layer, and the fourth sub-interconnect layer are configured to be connected to different conductive layers 121, transmit an electrical signal of the conductive layers 121 to the peripheral region 110, and are subsequently connected to the test device in the peripheral region 110 to test the performance of the conductive layers 121.

In this embodiment, each of the support structures 220 is an I-shaped structure. Each of the support structures 220 has an I-shape with a length ranging from 0.2 um to 0.4 um, such as 0.25 um, 0.30 um, or 0.35 um. Each of the support structures 220 has an I-shape with a width less than 0.15 um, such as 0.06 um, 0.09 um, or 0.12 um. A gap of the I-shaped support structure 220 has a width ranging from 0.3 um to 0.5 um, such as 0.35 um, 0.40 um, or 0.45 um.

In this embodiment, a is equal to 0.30 um, b is equal to 0.05 um, c is equal to 0.40 um. Therefore, each of the I-shaped structures formed has larger space, which further reduces the coverage area of the contact structure.

In this embodiment, the width of the I-shape of each of the formed I-shaped structures is greater than twice the minimum line width of the semiconductor substrate 100. Therefore, the stability of the formed support structure 220 is further ensured.

Compared with the related art, this disclosure reduces the area of the peripheral region occupied by the support structures, thereby reducing the stress on the support structures and preventing metal peeling from occurring in the memory formed by the above-mentioned semiconductor structure.

For highlighting innovative parts of the disclosure, components related not so closely to the technical problem to be solved in the disclosure are not introduced in the embodiment, but this does not mean that there are no other structures in the embodiment.

The above-mentioned embodiments correspond to the present embodiment, so that the present embodiment can be matched with the above-mentioned embodiments for implementation. The related technical details mentioned in the above-mentioned embodiment are still effective in the present embodiment, and the technical effects that may be achieved in the above-mentioned embodiment may also be achieved in the present embodiment. For reducing repetitions, elaborations are omitted herein. Correspondingly, related technical details mentioned in the present embodiment may also be applied to the above-mentioned embodiments.

Those of ordinary skill in the art can understand that each embodiment is a specific embodiment implementing the disclosure, and in practical disclosures, various variations about the form and details can be made thereto without departing from the spirit and scope of the disclosure.

The invention claimed is:

1. A semiconductor structure, comprising:
 a semiconductor substrate comprising an array region and a peripheral region, a plurality of conductive layers being arranged in the array region and separated from each other;
 a plurality of support structures separated from each other and located on the peripheral region, the support structures comprising a support layer, voids being provided between the support structures separated from each other to reduce an area of the peripheral region occupied by the support structures; and
 an interconnect structure located on the array region and the peripheral region, the interconnect structure comprising the support layer and an interconnect layer located in the support layer, the interconnect layer being electrically connected to a respective one of the conductive layers and transmitting an electrical signal of the respective one of the conductive layers to the peripheral region.

2. The semiconductor structure of claim 1, wherein the support layer is a stack.

3. The semiconductor structure claim 1, wherein each of the support structures is an I-shaped structure.

4. The semiconductor structure of claim 2, wherein each of the support structures has an I-shape with a length ranging from 0.2 μm to 0.4 μm and a width less than 0.15 μm, and a gap of the I-shape has a width ranging from 0.3 μm to 0.5 μm.

5. The semiconductor structure of claim 4, wherein the length of the I-shape is 0.3 μm, the width of the I-shape is 0.05 μm, and the width of the gap of the I-shape is 0.4 μm.

6. The semiconductor structure of claim 4, wherein the width of the I-shape of each of the support structures is greater than twice a minimum line width of the semiconductor substrate.

* * * * *